(12) United States Patent
Schiffer

(10) Patent No.: US 10,837,984 B2
(45) Date of Patent: Nov. 17, 2020

(54) TRANSDUCER FOR HIGH-VOLTAGE MEASURING TECHNOLOGY

(71) Applicant: Knick Elektronische Messgeräte GmbH & Co. KG, Berlin (DE)

(72) Inventor: Jens-Hendrik Schiffer, Potsdam (DE)

(73) Assignee: KNICK ELEKTRONISCHE MESSGERÄTE GMBH & CO. KG, Berlin (DE)

( * ) Notice: Subject to any disclaimer, the term of this patent is extended or adjusted under 35 U.S.C. 154(b) by 132 days.

(21) Appl. No.: 16/313,672

(22) PCT Filed: Jun. 22, 2017

(86) PCT No.: PCT/EP2017/065415
§ 371 (c)(1),
(2) Date: Dec. 27, 2018

(87) PCT Pub. No.: WO2018/001863
PCT Pub. Date: Jan. 4, 2018

(65) Prior Publication Data
US 2019/0250192 A1    Aug. 15, 2019

(30) Foreign Application Priority Data

Jun. 29, 2016    (DE) .................. 10 2016 211 755

(51) Int. Cl.
*G01R 1/20*    (2006.01)
*G01R 15/14*   (2006.01)
(Continued)

(52) U.S. Cl.
CPC .......... *G01R 15/144* (2013.01); *G01D 11/24* (2013.01); *G01D 11/245* (2013.01); *G01D 11/30* (2013.01);
(Continued)

(58) Field of Classification Search
CPC ............. G01R 19/0092; G01R 1/203; G01R 19/0084; G01R 15/16; G01R 21/06; G01R 35/005; G01R 15/18; G01R 19/2513
(Continued)

(56) References Cited

U.S. PATENT DOCUMENTS

2005/0068135 A1*  3/2005  Nishino ................. G05G 9/047
                                                            335/207
2010/0007358 A1   1/2010  Schaerrer et al.
(Continued)

FOREIGN PATENT DOCUMENTS

| CN | 204425175 U | 1/2015 |
| DE | 102010029374 A1 | 12/2011 |
| DE | 102013204673 A1 | 9/2014 |

OTHER PUBLICATIONS

Norm DIN EN 61010, "Safety requirements for electrical equipment for measurement, control and laboratory use" (Jul. 2010).
(Continued)

*Primary Examiner* — Raul J Rios Russo
(74) *Attorney, Agent, or Firm* — Browdy and Neimark, PLLC

(57) ABSTRACT

A transducer for high-voltage measuring technology, including a housing having a parallelepipedal basic contour, input connections arranged on the housing and carrying input measurement signals in the high-voltage range, output connections arranged on the housing and carrying output signals in the low-voltage range, a transducer circuit arranged in the housing and implemented on a printed circuit board and being contact-connected to the input and output connections. The parallelepipedal basic contour of the housing is designed as an upright construction. The printed circuit board is arranged upright between opposite side walls of a dome formed in the housing. The input connections are arranged facing away from one another on the outer sides of
(Continued)

the side walls within the basic contour of the housing, and in a manner engaging through the respective side wall of the dome are in contact with contact elements of the transducer circuit on the printed circuit board.

19 Claims, 14 Drawing Sheets

(51) Int. Cl.
| | |
|---|---|
| *G01R 1/04* | (2006.01) |
| *G01R 1/067* | (2006.01) |
| *G01D 11/24* | (2006.01) |
| *G01D 11/30* | (2006.01) |
| *G01R 19/00* | (2006.01) |
| *G01R 15/16* | (2006.01) |
| *G01R 21/06* | (2006.01) |
| *G01R 35/00* | (2006.01) |
| *G01R 15/18* | (2006.01) |
| *G01R 19/25* | (2006.01) |

(52) U.S. Cl.
CPC ........... *G01R 1/04* (2013.01); *G01R 1/06777* (2013.01); *G01R 1/203* (2013.01); *G01R 15/16* (2013.01); *G01R 19/0084* (2013.01); *G01R 19/0092* (2013.01); *G01R 15/18* (2013.01); *G01R 19/2513* (2013.01); *G01R 21/06* (2013.01); *G01R 35/005* (2013.01)

(58) Field of Classification Search
USPC ............. 324/72, 76.11–76.83, 115, 126, 149
See application file for complete search history.

(56) References Cited

U.S. PATENT DOCUMENTS

2010/0304583 A1* 12/2010 Busse ................... H04Q 1/155
439/76.1
2017/0229819 A1* 8/2017 Simon ................... G01D 11/00

OTHER PUBLICATIONS

ABB Current sensors, voltage sensors and voltage detectors, "Sensor / Capteur VS1500B" pp. 1-8 (Nov. 6, 1996).
Lem International Sa: "Railway Current & Voltage Transducers Content"), pp. 1-26, XP055401978 (Dec. 31, 2013).
LEM International SA: "DV series Voltage Transducer Insulated High Voltage measurement", pp. 1-16, (Sep. 9, 2008).
ABB Technical catalog, "Current sensors Voltage sensors", pp. 1-31 (Feb. 24, 2015).
Norm DIN EN 50124, "Railway applications, insulation coordination" (Mar. 2016).
Norm DIN EN 50178, "Elecetronic equipment for use in power installations" (Apr. 1988).
UL 347 "UL Standard for Safety Medium-Voltage AC Contactors, Controllers, and Control Centers", pp. 1-3, (Jan. 2016).
Mors Smiff B.V. MSV200, "Hall effect transducer", pp. 1-6 (Mar. 2013).
Lister, Charles A., "Design Considerations in Medium Voltage Starters for Underwriters' Laboratories' Standards", IEEE Transactions on Industry, pp. 128-134, (Mar. 1978).

* cited by examiner

TRANSDUCER FOR HIGH-VOLTAGE MEASURING TECHNOLOGY

CROSS-REFERENCE TO RELATED APPLICATIONS

The present application claims the priority of the German patent application Serial No. DE 10 2016 211 755.6, filed on Jun. 29, 2016, pursuant to 35 U.S.C. 119 (a)-(d), the content of which is incorporated herein by reference in its entirety as if fully set forth herein.

FIELD OF THE INVENTION

The invention relates to a transducer for high-voltage measuring technology comprising a housing having a parallelepipedal basic contour, input connections arranged on the housing and carrying input measurement signals in the high-voltage range, output connections arranged on the housing and carrying output signals in the low-voltage range, a transducer circuit arranged in the housing and implemented on at least one printed circuit board, said transducer circuit being contact-connected to the input and output connections.

BACKGROUND OF THE INVENTION

For understanding the invention, the background thereof should be briefly explained. In this regard, there are diverse areas of application for transducers in high-voltage measuring technology (HV measuring technology). If the signals to be measured are in a range of high voltages—e.g. power supplies of production installations, buildings, railroad installations—then these high voltages have to be kept away from the control technology, that is to say have to be sufficiently galvanically isolated and converted into a measurement signal that is safe for persons and installations. The applicant for example offers transducers for operating voltages of up to 6000 V AC/DC. Particularly in the case of small signals at high potential, a high common-mode rejection (CMRR) has to be ensured since common-mode voltages can otherwise cause considerable errors. Independently of the magnitude of the voltage to be measured, particularly in the case of large distances between signal source and signal sink, potential differences between measurement location and control technology can arise which can lead to considerable measurement errors. As a result of the potential isolation, the effects of these potential differences are completely eliminated and measurement errors are thus eliminated. Known transducers offer a 3-port potential isolation, such that negative signal influencing is prevented in any case.

Close prior art is described for example in US 2010/0007358 A1, which, in accordance with the accompanying FIG. 15 taken from said document, discloses a transducer having the following features:
  a housing (102) having a parallelepipedal basic contour,
  input connections (108) arranged on the housing (102) and carrying input measurement signals in the high-voltage range,
  output connections (110, 112) held on the housing (102) and carrying output signals in the low-voltage range,
  a transducer circuit arranged in the housing (102), implemented on at least one printed circuit board (124) and having various components (106 to 146), said transducer circuit being contact-connected to the input and output connections (108, 110, 112).

In principle, such HV transducers comprise at least two spatially separated connection regions, namely the above-mentioned input connection region for the electrical connection of at least one input signal (carrying high voltage) and the output connection region for tapping off at least one galvanically isolated output signal and e.g. for the supply of electrical auxiliary energy.

The problem manifested in the prior art shall now be explained in greater detail with reference to FIG. 15:

The input connection bolts (108) have an external thread (e.g. M5) and are led through large-volume rib insulators (150) in order to achieve a sufficiently long creepage path both between the two input connection bolts (108) themselves and between the input connection bolts (108) and the components and mounting surfaces in direct proximity to the mounting location of the transducer.

On account of the only small exit height of the input connection bolts (108) of only approximately 25 mm above the mounting surface, the insulation air clearance with respect to a possibly electrically conductive mounting surface is relatively small. The customary technology for connection to such connection bolts uses cable lugs having a hole having a diameter of somewhat greater than 5 mm, which are plugged onto the bolts and then fixed by means of at least one nut in each case. The angular position of the cable lugs on the connection bolts is naturally not defined here. As a result, in the event of negligent installation, reduced insulation air clearances can occur because the cable lugs approach one another or the opposite connection bolt or the mounting surface in an undesired manner. Furthermore, torques can act on the cable lugs through the leads, which torques can re-suit in subsequent twisting of the cable lugs on the connection bolts and even to loosening of the cable lugs.

This problem also applies, in principle, to the output-side connection bolts (110, 112), which can likewise be provided with an M5 external thread. In the case of an electrically conductive mounting surface, the air clearance and the creepage path between the input connection bolts (108) and the output connection bolts (110, 112) are thereby possibly reduced as well.

In the case of the high-voltage transducer illustrated in FIG. 15, protective coverings are provided neither for the input connection bolts nor for the output connection bolts. As a result, there is the risk that external environment influences, such as moisture, dust, dirt, can impair the effect of the creepage paths and the metallic contact elements can be subjected to increased corrosion. Moreover, protection against electric shock is not provided either, and so present demands in respect of safety of persons, e.g. in the context of installation and maintenance work, are not satisfied.

Deficiencies can also be ascertained in connection with the internal housing features: the electrical connections of the connection bolts (108) to the printed circuit board are realized with the aid of stranded interconnecting wires (152). The position of said stranded interconnecting wires is not unambiguously defined. Particularly on the high-voltage-carrying input side of the transducer, this can lead to undesired influencings of the signal transmission and possibly of the insulation.

A transducer constructed in accordance with FIG. 15 can have the following typical dimensions and distances:

The mounting surface mentioned below stretches between the four illustrated securing cantilevers (154) having the U-shaped recesses. The height of the connection bolts (108, 112, 110) above the mounting surface is approximately 25 mm, the distance between the bolts (108) is approximately 70 mm, the distances between the output bolts (112, 110) are approximately 12 mm, the housing height above the mounting plate is approximately 50 mm, the total width of the transducer incl. securing cantilevers is approximately 134 mm and the total length of the transducer incl. bolts (108, 110, 112) is approximately 210 mm.

To summarize, a relatively large area requirement of approximately 280 cm$^2$ and limited distances between the voltage-carrying parts and between the latter and the mounting surface can be noted in the case of this transducer on account of the flat-parallelepipedal housing contour.

Further known transducers having similar housing configurations are offered commercially by various manufacturers, such as, for example, by ABB France under the designation "Sensor/Capteur VS1500B". In the case of this device, by comparison with the transducer illustrated in FIG. 15, the distance between the input connection bolts and a mounting surface is indeed greater, since the input connection bolts are arranged on the top side of the housing. However, the problematic points which have already been described with reference to the prior art cited above and which do not relate to the distances with respect to the mounting surface are likewise applicable here.

In addition, as a result of the spatial proximity of one of the input connection bolts to the output connection bolts situated on the side of the transducer, the creepage paths and air clearances can be disadvantageously shortened in the event of unfavorable alignment of the cable lug and/or of the connection lines and the insulation capability can thus be reduced.

SUMMARY OF THE INVENTION

Proceeding from the outlined problems of the prior art, the invention is based on the object of improving a transducer for high-voltage measuring technology such that in conjunction with reduced area requirement, said transducer especially satisfies stringent requirements in respect of the insulation properties and insensitivity to external environmental influences.

The basic conception of the solution according to the invention as claimed herein is characterized as follows:
- the parallelepipedal basic contour of the housing is designed as an upright construction with a width that is shorter than the length of the base surface and with a height that is greater than the width,
- the printed circuit board with the transducer circuit is arranged upright between opposite side walls of an insulating dome formed in the housing, and
- the input connections are arranged facing away from one another on the outer sides of the side walls within the basic contour of the housing, and in a manner engaging through the respective side wall of the dome are in contact with connection elements of the transducer circuit on the printed circuit board.

An essential distinguishing feature of the high-voltage transducer according to the invention is the design of the housing as an upright construction and the specific arrangement of the high-voltage-carrying input connection elements in the housing, wherein the input connection elements can be embodied in particular as input connection bolts having an external thread. Further embodiments of the input connection elements can also be threaded bushes or clamping connections.

The input connections are positioned on opposite longitudinal sides of the housing, specifically on the central dome, which is preferably an integral part of the housing form according to the invention. In the input connection region, the housing according to the invention and the high-voltage-carrying input connections are shaped such that the input connections do not project beyond the housing contour.

In accordance with one preferred development of the transducer according to the invention, the lateral edge ratios of the housing are such that the ratio of width to length of the housing is between 1:2 and 1:3 and/or the ratio of width to height of the housing is between 1:1.5 and 1:2.5.

On account of the arrangement of the input connections within the basic contour of the housing, in accordance with one development, a covering in the form of a protective hood that fully encloses the high-voltage-carrying input connection region can be emplaced, without the exterior outline contour of the transducer being appreciably enlarged. This protective hood that can be emplaced can be fixedly screwable to the housing using one or more screws and/or else be fixed thereto by means of latching elements.

Preferably, the protective hood can be secured to the housing pedestal with the inclusion of sealing elements; by way of example, in this case in specific sections said protective hood has recesses in the form of a groove, for example for receiving a sealing elastomer, which in turn together with the sealing surfaces present in specific sections of the housing guarantees a circumferential sealing. Particularly high protection against contamination and ingress of moisture is thus ensured. The protective hood can additionally serve as protection against electric shock if corresponding installation regions in which hazardous voltages and currents can occur are accessible to persons during maintenance work.

As an interim result it should be emphasized that the embodiment of the transducer according to the invention leads to a considerable space and area saving on the mounting surface by comparison with the prior art. This is achieved firstly by virtue of the upright construction with a small basic area, secondly by virtue of the arrangement of the input connections on the long sides on the central dome, and also by virtue of the protective hood that can be emplaced, as a result of which a mounting-insulation protection distance with respect to adjacent components can be kept very small. The connection space for the input connection bolts that is formed by the protective hood and the housing with its central dome can moreover be equipped with ventilation channels, such that said connection space can be ventilated in the direction toward the baseplate in order to achieve climate equalization.

In accordance with a further preferred embodiment, a respective through opening for leading an input-side high-voltage connection line through to the input connections is arranged in the housing in each case laterally alongside the dome preferably in a vertical side wall, wherein sleeves e.g. composed of an elastomer are insertable into the through openings and can act as sealing elements and anti-kink protection. Preferably, in this case, said through openings are formed in the edge of the housing pedestal facing the protective hood, as a cutout open transversely with respect to the lead-through direction of the high-voltage connection lines. Very simple mounting of the connection lines is thus achieved, which, with the protective hood removed, are pushed into said cutouts from the side if appropriate with a sleeve and then after the securing of the cable lugs on the corresponding input connection bolts with the fixing of the connection line with sleeve, the protective hood is latched onto the housing pedestal.

As a result of this guidance of the connection lines, an optimum position of the cable lugs thereof is defined and torques acting on the cable lugs through the leads can be minimized in particular after the protective hood has been emplaced. The upright design of the housing "automatically" ensures a maximum distance with respect to the mounting surface of the connection lines. This distance is significantly greater than in the case of the transducers according to the prior art outlined in the introduction.

In a further preferred embodiment of the invention, there are arranged at the dome insulation roofs projecting above the input connections and/or insulation webs extending alongside the input connections. In addition, surface regions of the dome facing the input connections and—if present— the insulation roofs can be provided with a superficial rib profiling.

By virtue of said insulation roofs and the possibly present insulation webs and rib profilings thereon, the creepage path between the opposite input connections is lengthened.

One preferred embodiment of the input connections provides for the latter to be configured as connection bolts which are held in a press-fitted manner in each case in receptacles in the side walls of the dome and, as a result of the press-fit process, are electrically conductively connected to electrical contact pads of the transducer circuit on the printed circuit board. Therefore, there is no need for stranded interconnecting wires for connecting the input connection bolts to the printed circuit board. The disadvantages mentioned in the introduction, such as can arise in the case of a wiring embodied using stranded interconnecting wires in the case of transducers according to the prior art, are thus avoided. Moreover, the press-fit process can be carried out completely mechanically and in automated fashion, which would be possible only with difficulty in the case of the use of stranded interconnecting wires.

In order to improve the functional division of the components of the transducer, in a further preferred embodiment it can be provided that there is provided on an outer side, preferably a narrow side, of the housing, an output connection region which is separated from the transducer circuit, to which high voltage is applied, by a partition in the housing and in which the low-voltage output connections and, if appropriate, further auxiliary energy connections, operating and/or signaling elements are arranged. Thus the output connection region is fundamentally separated from the actual main region of the printed circuit board having the function-generating components of the transducer circuit, which opens up the basis for a further preferred embodiment of the invention, according to which the interior of the dome with said function-generating components can be hermetically sealed by a potting, without this potting compound penetrating into the output connection region. The potting compound that can be introduced protects the electronics against harmful environmental influences, increases the resistance to mechanical loads and ensures the electrical insulation of the various circuits on the printed circuit board relative to one another and with respect to the direct mounting environment of the transducer.

In accordance with a further embodiment of the invention, there are provided in the partition a preferably sealable slot open to the base of the housing and serving for passage of the printed circuit board, which is preferably configured in an integral fashion, and also in the printed circuit board as an extension of the slot a preferably sealable recess for passage of the partition, said recess being open to its upper edge facing away from the base. A particularly simple mountability of the printed circuit board in the housing with the partition is thus achievable, wherein the possibility of the potting of the interior is in turn maintained by means of the sealants. Specifically, as the printed circuit board is inserted into the housing during the factory assembly of the transducer, that part of the printed circuit board which mechanically and electrically connects the connection region to the remainder of the electronics descends into said slot. In this case, the slot in the partition can have sealants, e.g. an elastomer. In this case, the above-described recess in the printed circuit board is shaped such that as the printed circuit board is inserted into the housing, the partition descends into said recess of the printed circuit board. After the complete insertion of the printed circuit board, the contact locations of the printed circuit board for the contacting of the input connection bolts that are to be introduced later are then situated in the corresponding section within the central dome of the housing.

In accordance with one advantageous embodiment of the invention, it is furthermore provided that on the outer side in front of the partition a screen part is arranged in the output connection region between the section there of the printed circuit board and the low-voltage output connections fitted marginally to the printed circuit board and, if appropriate, further auxiliary connections, operating and/or signaling elements. Said screen part serves for covering the printed circuit board region located behind the output and auxiliary energy terminals and operating and signaling elements and can act as visual screen and protection against electric shock. Moreover, it can serve as inscription region and also as optical diaphragm for signaling means such as e.g. LEDs. Furthermore, the screen part can serve as guide element for test and calibration contacts or diagnosis contacts which can be used e.g. during a factory configuration or during a factory calibration.

Finally, in accordance with one preferred development, it is provided that the output connection region e.g. having the output terminals and auxiliary energy terminals and possible operating and signaling elements is protected against direct contamination and splash water by a protective cap. Said protective cap can be embodied in transparent fashion in order to be able to view signaling and operating elements from outside as well. Moreover, the output terminals and auxiliary energy terminals and possible operating and signaling elements are then manipulatable only after removal of the protective cap.

Further features, details and advantages of the invention are evident from the following description of an exemplary embodiment with reference to the accompanying drawings.

DESCRIPTION OF THE PREFERRED EMBODIMENT

Figure 1:
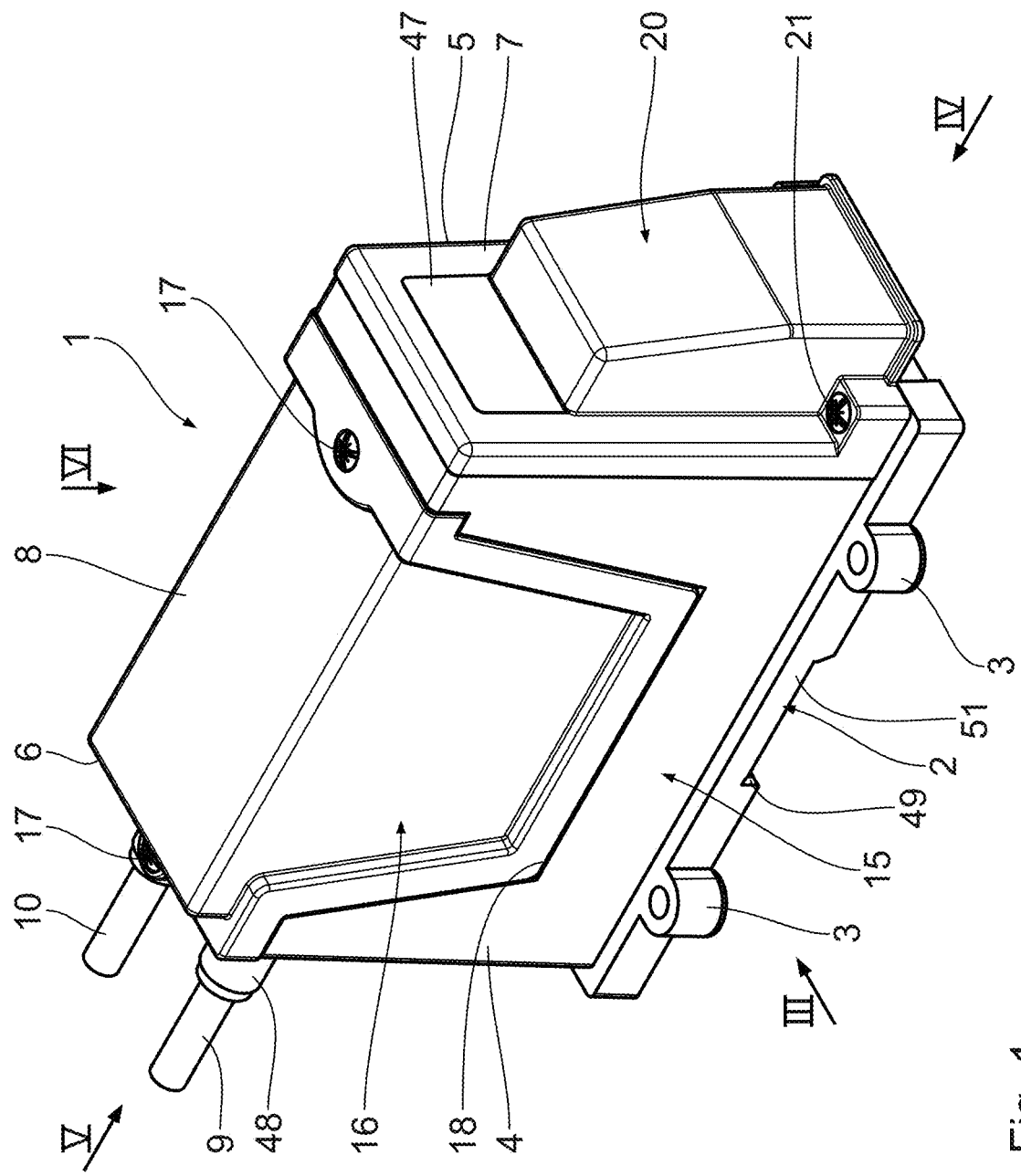
FIGS. 1 and 2 show perspective views of a high-voltage transducer from two different directions.
Figure 2:
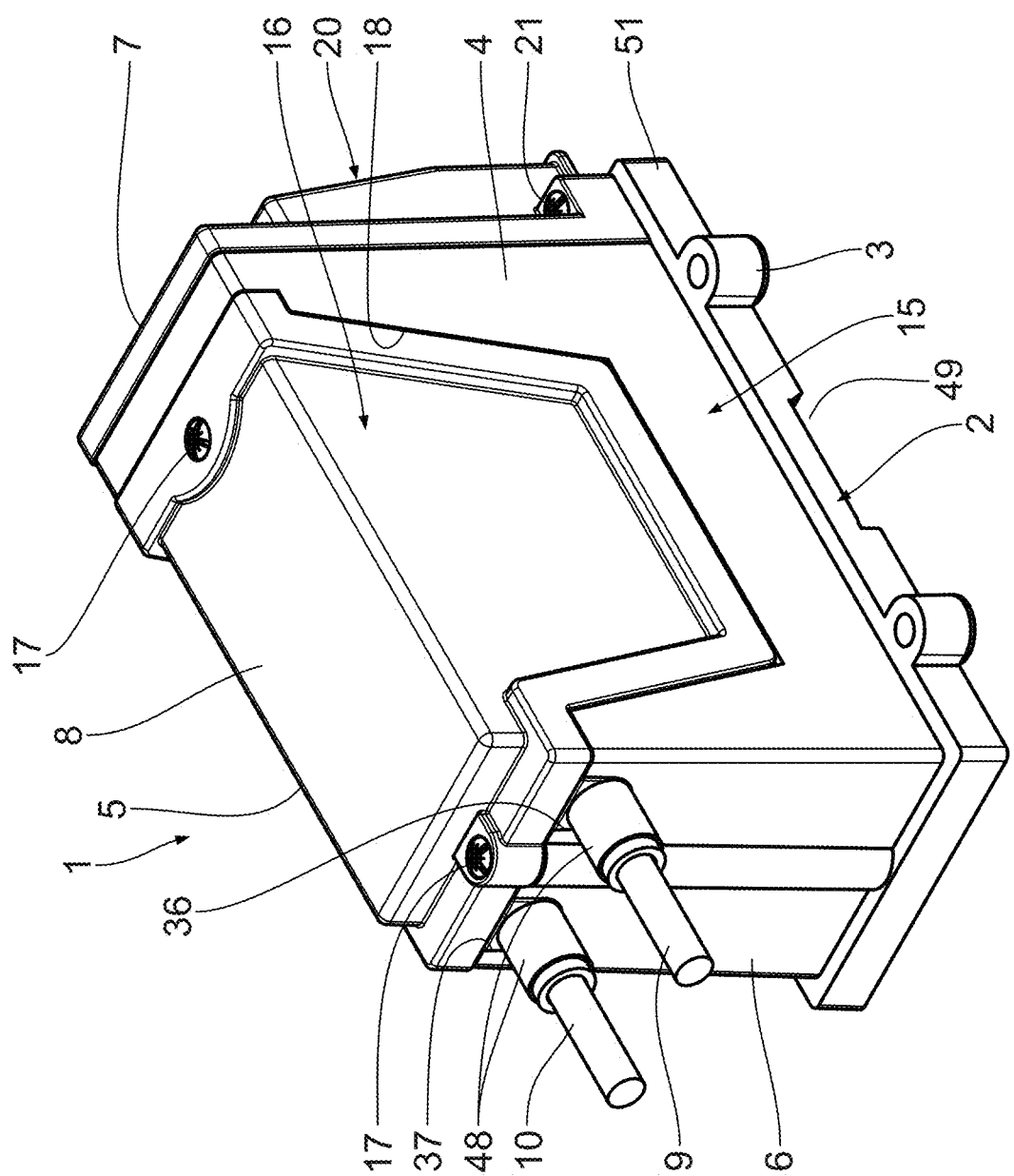
Figure 3:
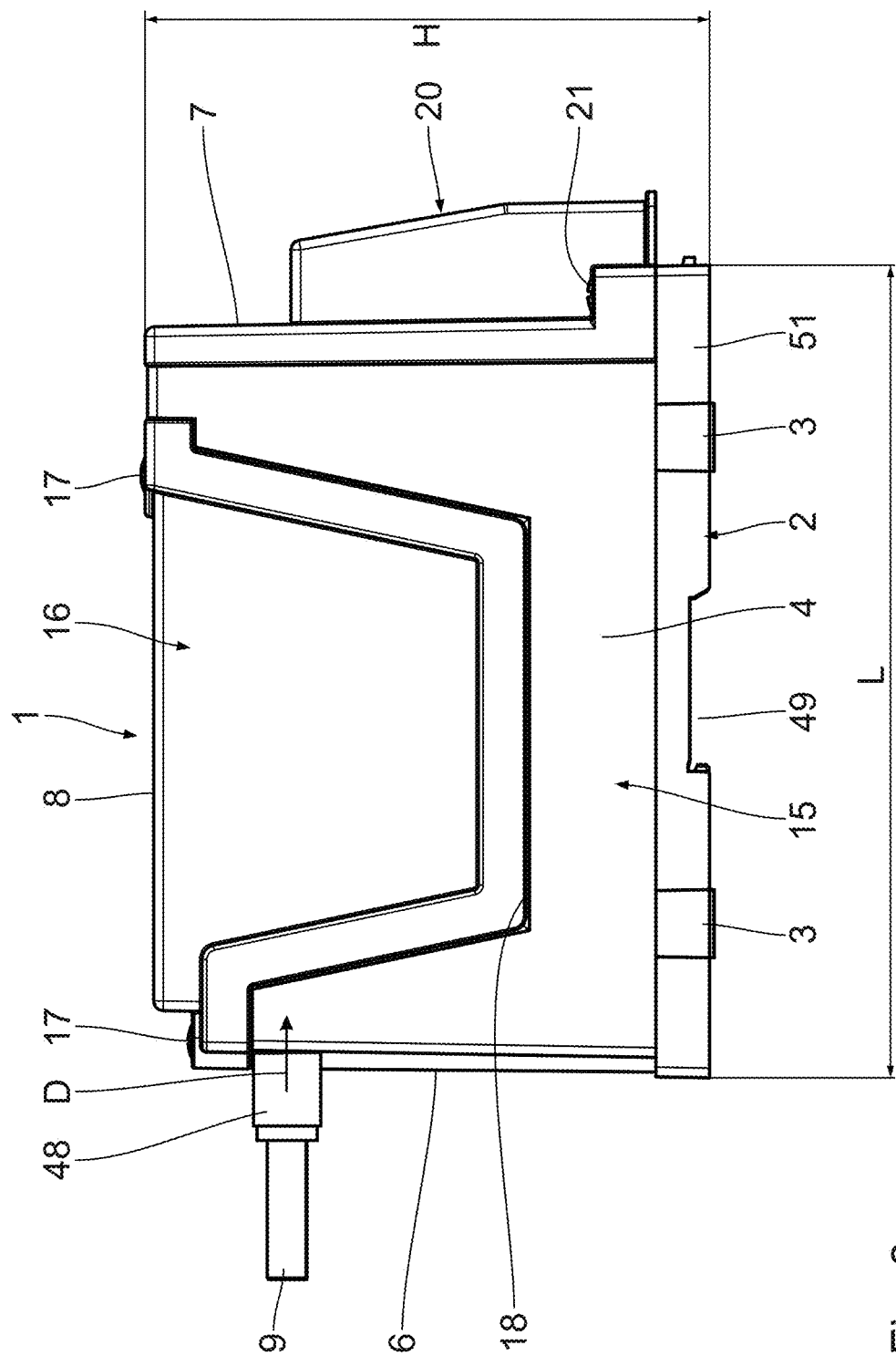
FIGS. 3 to 6 show views of the transducer from the arrow directions III to VI in accordance with FIG. 1.
Figure 4:
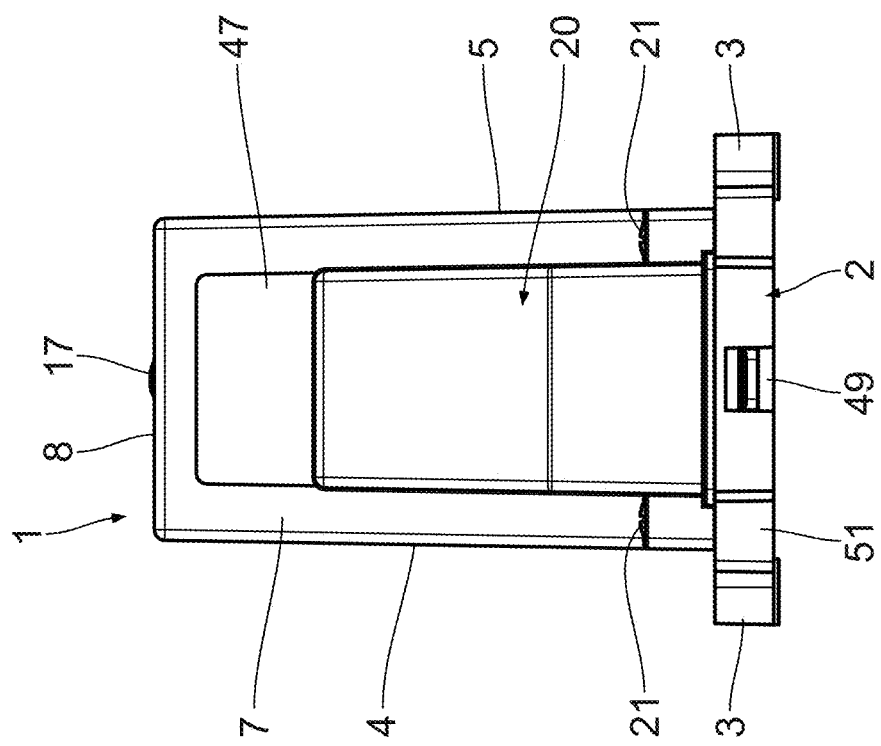
Figure 5:
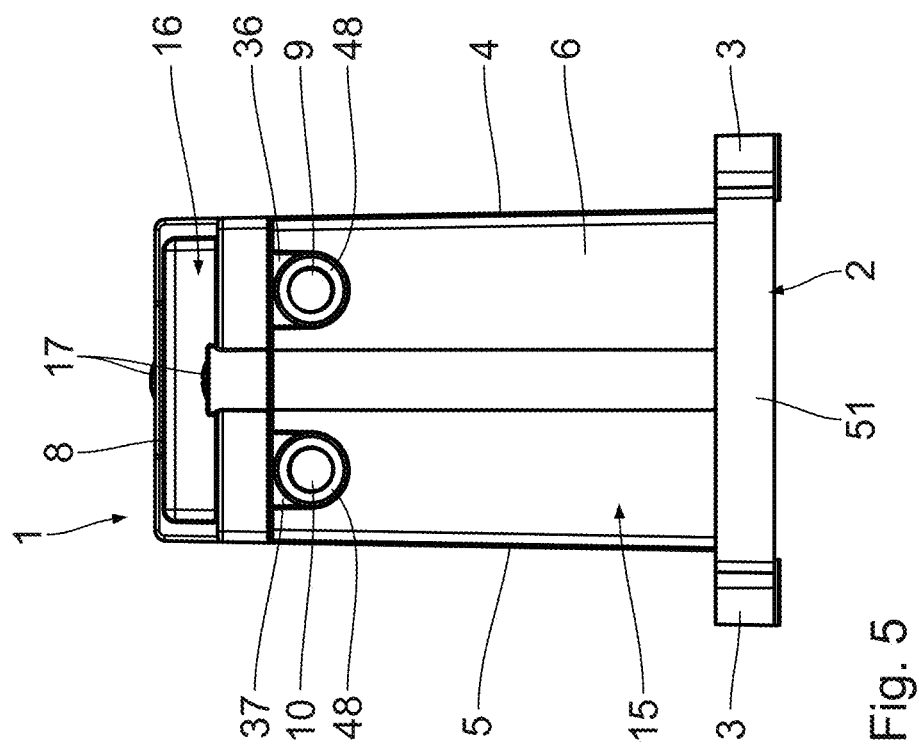
Figure 6:
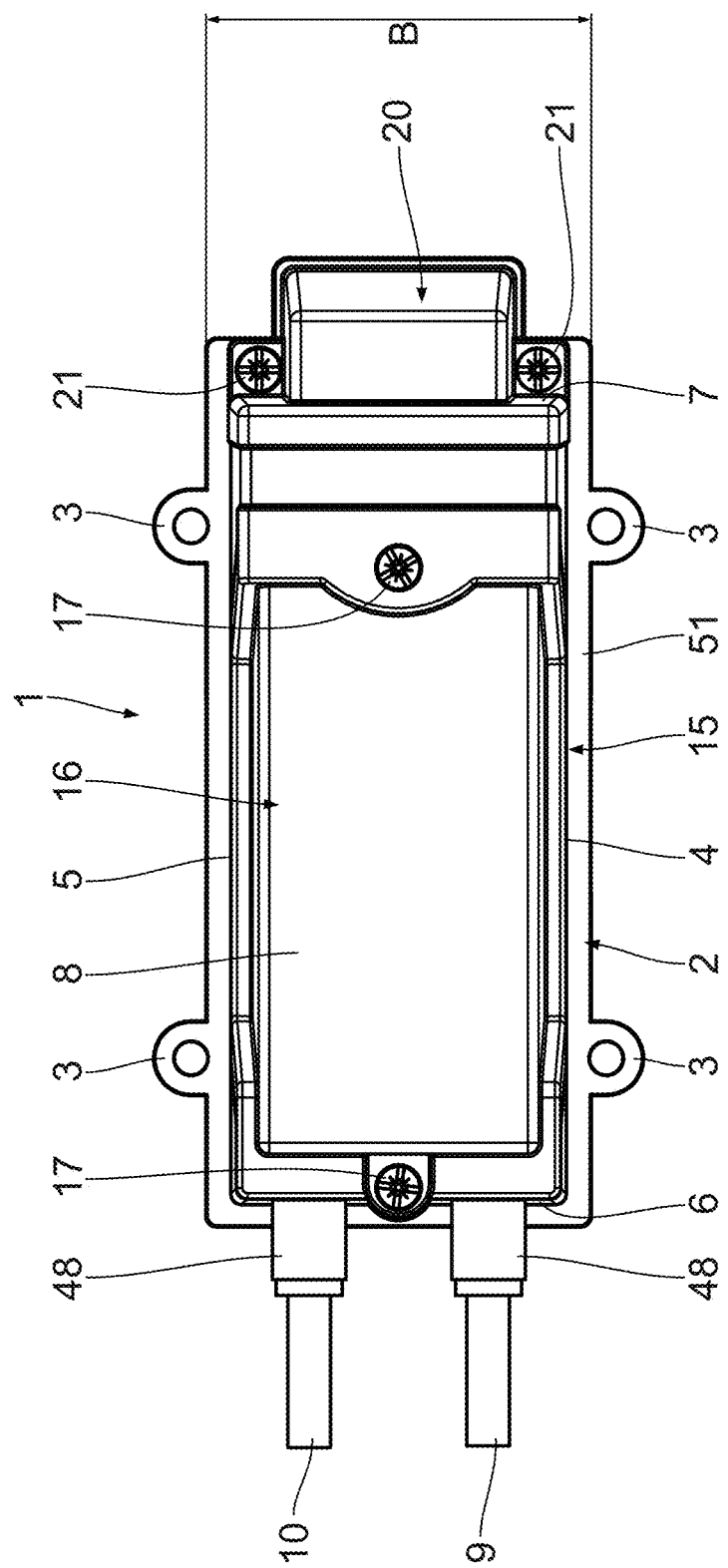

As becomes clear from FIGS. 1 to 6, the transducer for high-voltage measuring technology comprises a housing 1 composed of a customary insulating material, said housing exhibiting a parallelepipedal basic contour. In this case, an upright construction is chosen in which the base 2 of the housing 1 (without the securing eyes 3 for mounting) has a width B that is significantly smaller than the length L. In this regard, the width-length ratio of the base 2 and thus of the housing 1 is approximately 1:2.3. By contrast, the height H of the housing 1 is significantly greater than the width B. In this regard, in the case shown, the width-height ratio is approximately 1:1.7.

On account of the parallelepipedal shape, the housing 1 has, in principle, besides the base surface formed by the base 2, broad side walls 4, 5 facing away from one another, two narrow side walls 6, 7 facing away from one another, and a top wall 8. The two high-voltage connection lines 9, 10 for the transducer are led through one narrow side wall 6.

Figure 7:
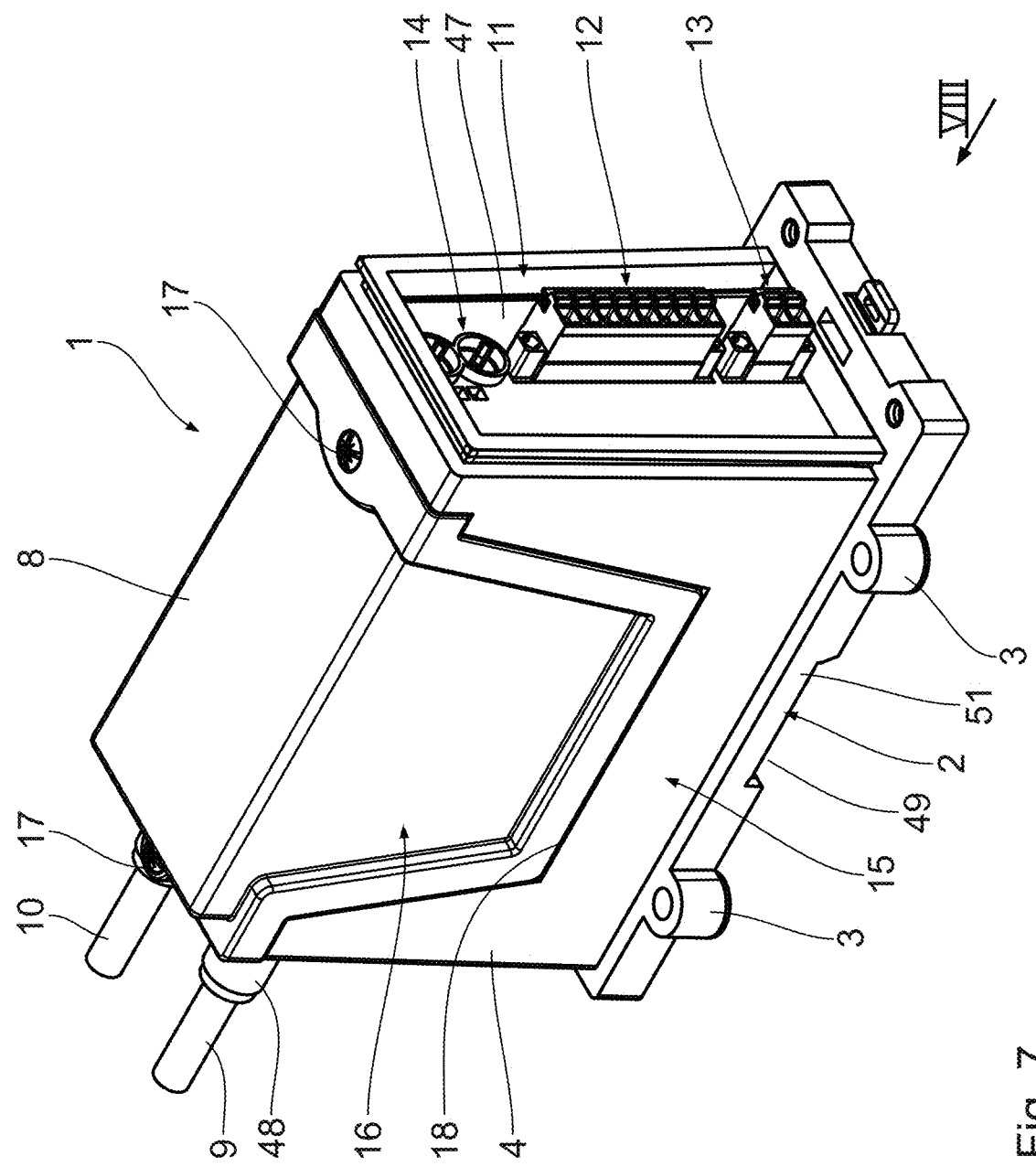
FIG. 7 shows a perspective view of the transducer in accordance with FIG. 1 with the protective cap for the output connection region having been removed.
Figure 8:
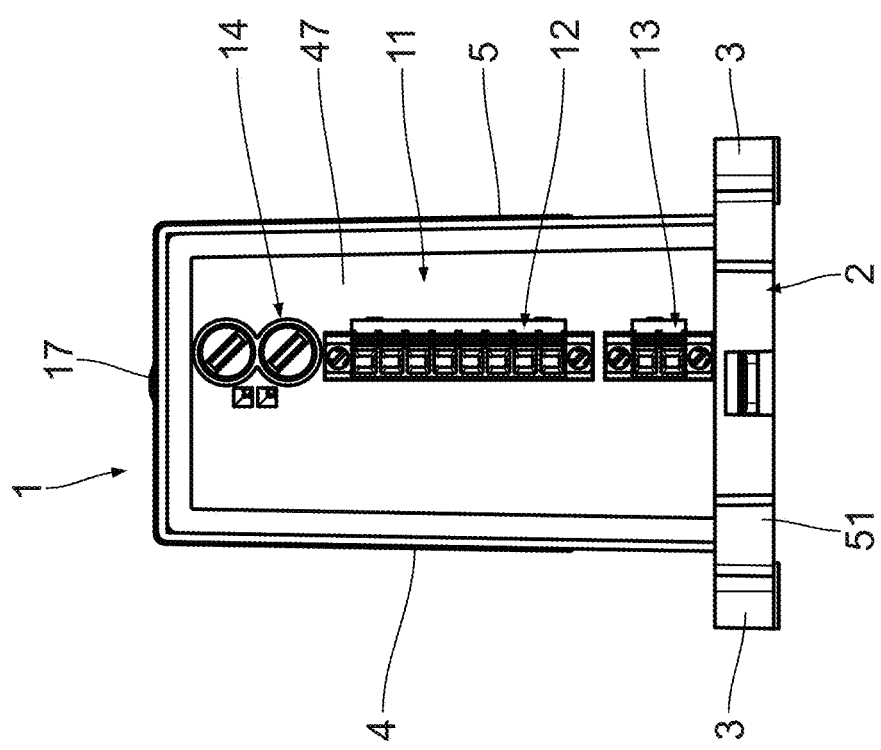
FIG. 8 shows a view of the narrow side of the transducer in accordance with arrow direction VIII according to FIG. 7.

The output connection region 11 is arranged on the opposite narrow side wall 7, in which output connection region are arranged, as becomes clear in particular from FIGS. 7 and 8, output terminals 12 for low-voltage signals, such as low-voltage measurement or auxiliary signals (for instance in the form of an error signal), auxiliary energy terminals 13 and operating and signaling elements 14, for example in the form of rotary switches, pushbuttons, tumbler switches or DIP switches and LEDs.

The housing 1 itself is subdivided into a housing pedestal 15 and a protective hood 16, which occupies part of the top wall 8 and of the two broad side walls 4, 5 and is removable from the housing pedestal 15. Said protective hood can be secured on the housing by means of screws 17, for example using lead seals. For sealing the housing interior, in this case, elastomer elements (not shown) extending circumferentially in the protective hood 16 are provided as sealing elements, which interact with corresponding sealing edges 19 at the hood-side edge 18 of the housing pedestal 15.

The protective cap 20 on the narrow side wall 7 of the housing 1, said protective cap being shown in FIGS. 1 to 4 and 6, serves for covering the output connection region and the elements arranged there. The protective cap 20 can also be secured to the housing pedestal by means of corresponding screws 21, wherein latching elements (not shown in more specific detail) can support the mounting and fixing.

While one main focus of the invention, namely the upright construction of the housing 1 in the basic contour thereof, becomes clear from FIGS. 1 to 6, the second main focus, namely the measures for optimizing the electrical insulation properties, can be explained with reference to FIGS. 9 to 14. In this regard, a centrally arranged dome 22 formed integrally with the housing pedestal 15 is provided within the housing 1, said dome being configured as downwardly open toward the base 2. The side walls 23, 24 of the dome that are situated opposite the broad side walls 4, 5 of the housing 1 serve primarily for receiving and fixing the bolt-type input connections 25, 26 of the transducer, said input connections being press-fitted in said side walls 23, 24. The input connections 25, 26 are thus arranged on outer sides 27, 28—facing away from one another—of the side walls 23, 24 of the dome 22 within the basic contour of the housing 1, such that the protective hood 16 can still be placed thereabove.

Figure 12:
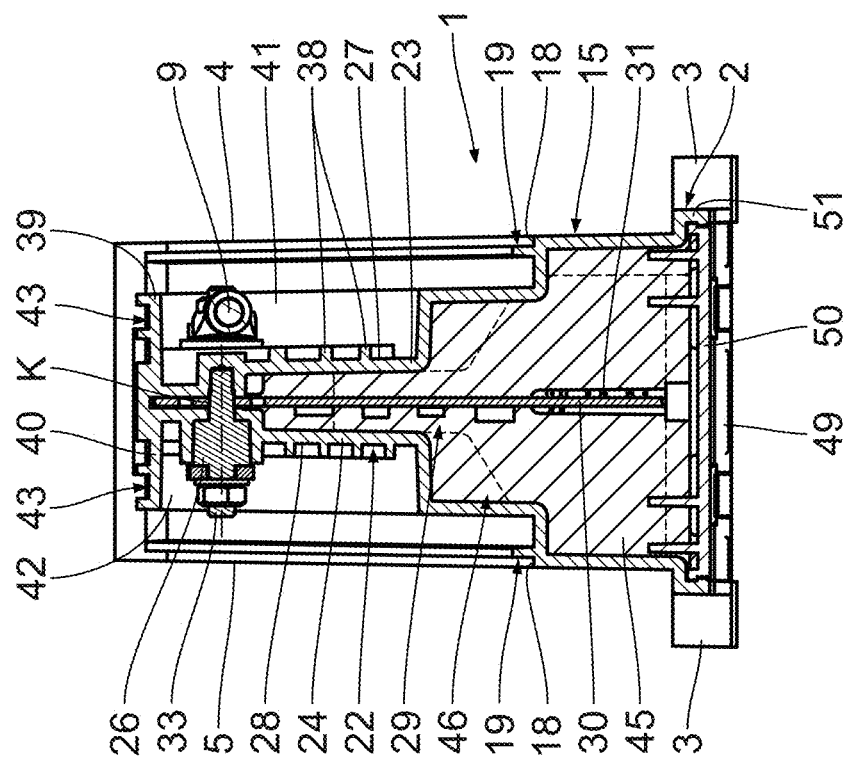
Figure 13:
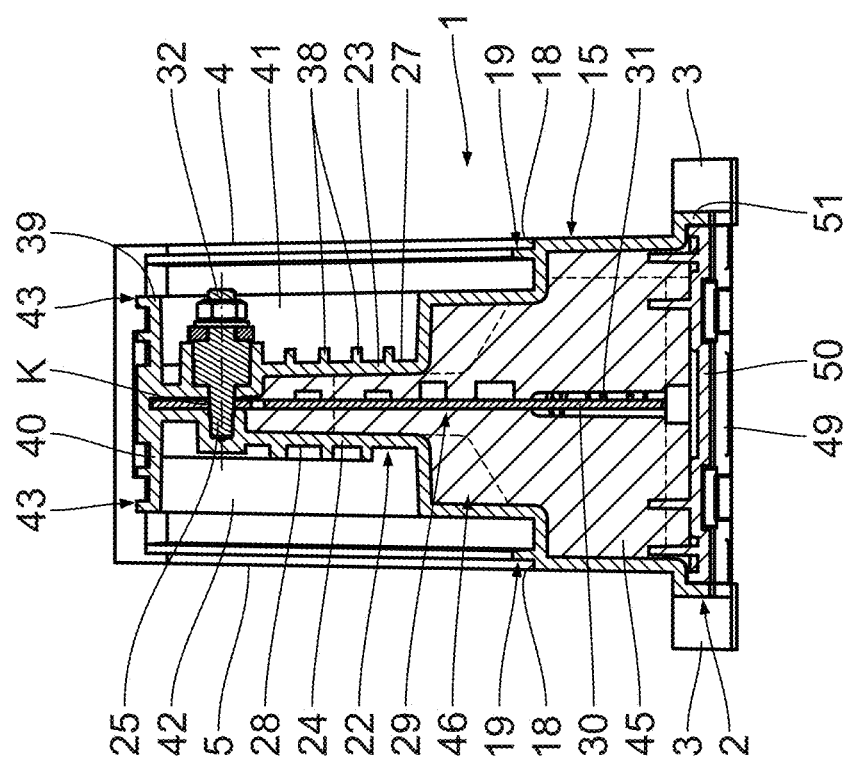

Between the side walls 23, 24, as can be gathered from the sectional illustrations in accordance with FIGS. 12 to 14, a printed circuit board 30, which carries the transducer circuit designated as a whole by 29, is inserted from below by way of corresponding guides 31 and is fixed in the housing 1 by the baseplate 2 and emplaced. The linking of the bolt-type input connections 25, 26 to corresponding contact pads K of the transducer circuit 29 on the printed circuit board 30 is carried out after the positioning of the printed circuit board 30 during press-fitting, wherein the input connections 25, 26 are simultaneously brought into contact with said contact pads K.

Figure 9:
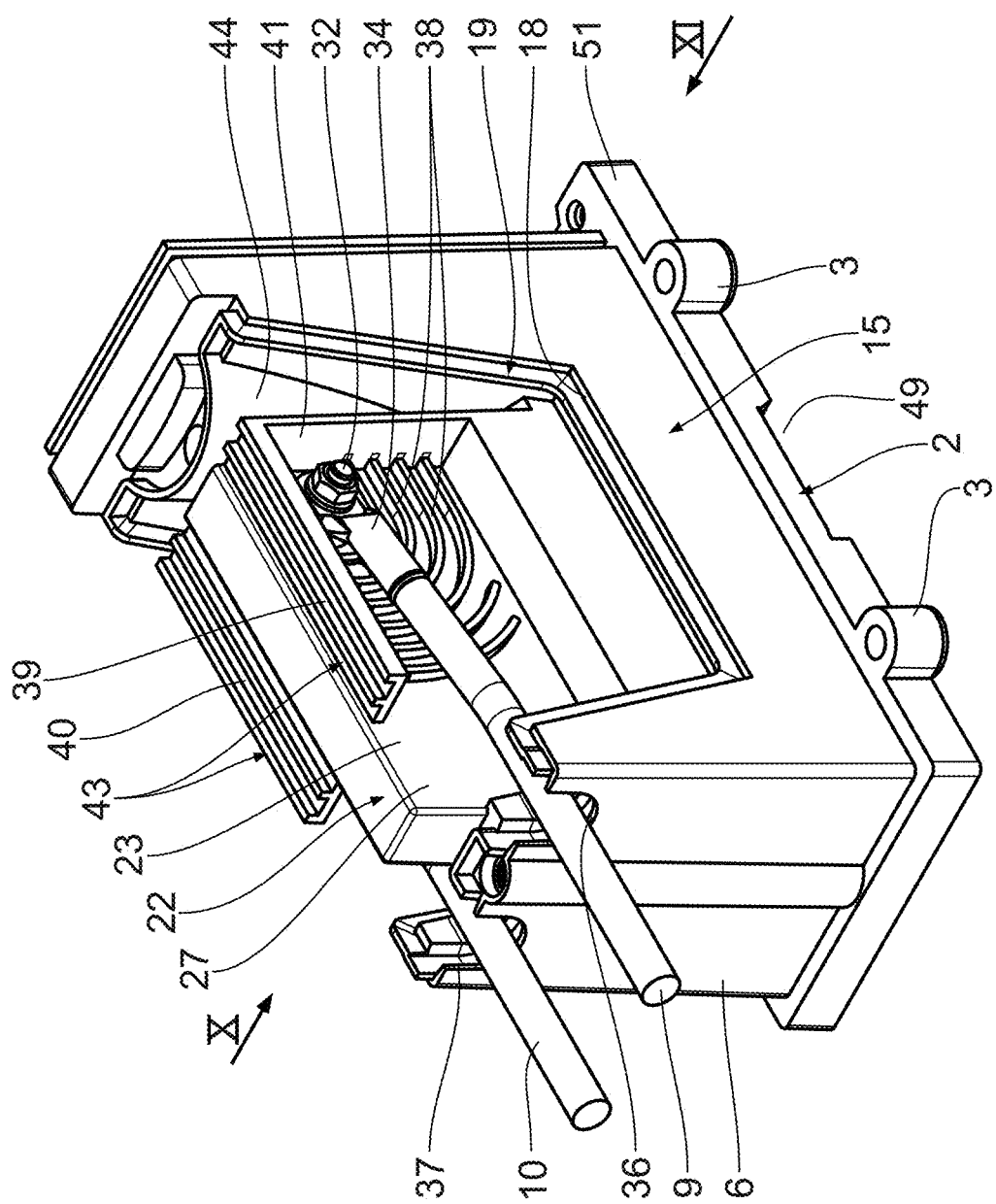
FIG. 9 shows a perspective view of the transducer without a protective cap above the output connection regions and with the protective hood for the input connection region having been removed.
Figure 10:
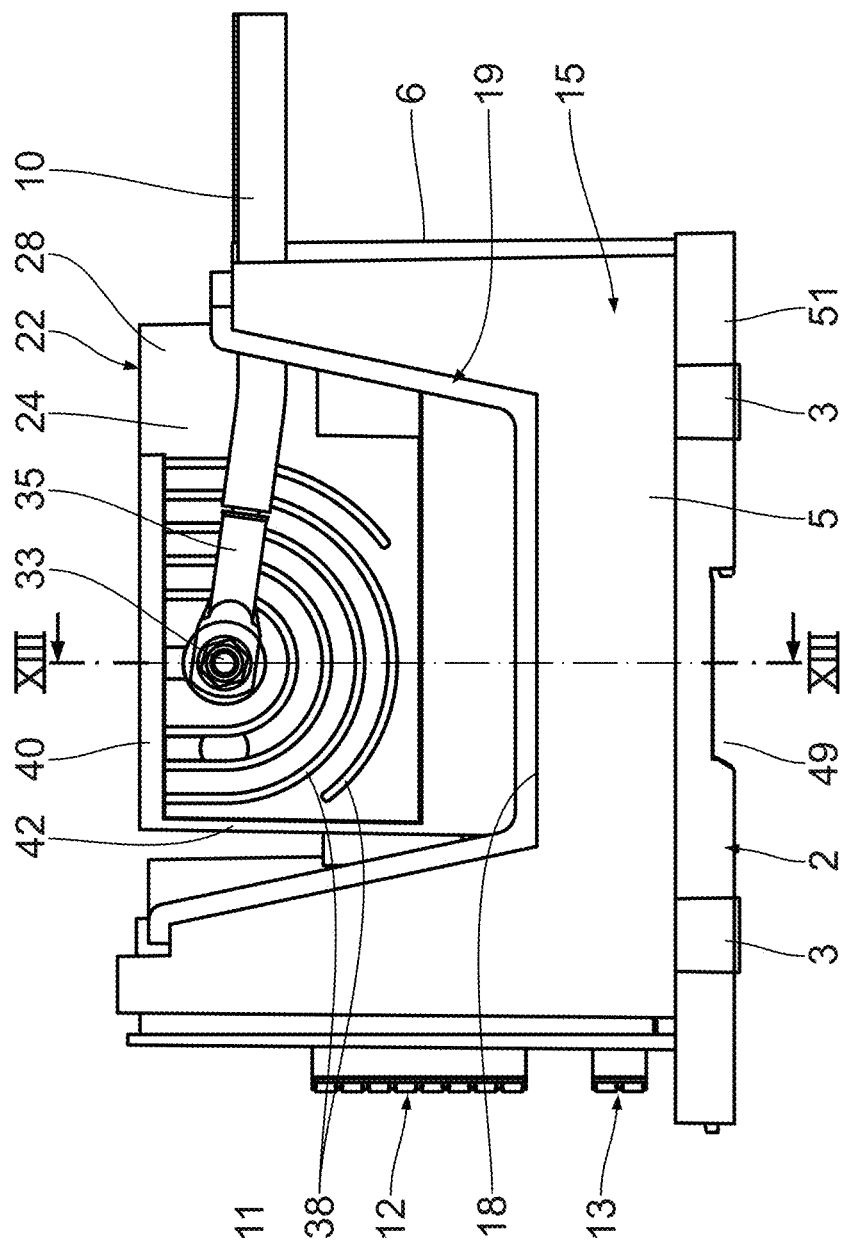
FIGS. 10 and 11 show side views of the transducer from arrow directions X and XI in accordance with FIG. 9, and FIGS. 12 to 14 show sectional illustrations of the transducer in accordance with sectional lines XII-XII, XIII-XIII and XIV-XIV in accordance with FIGS. 10 and 11.
Figure 11:
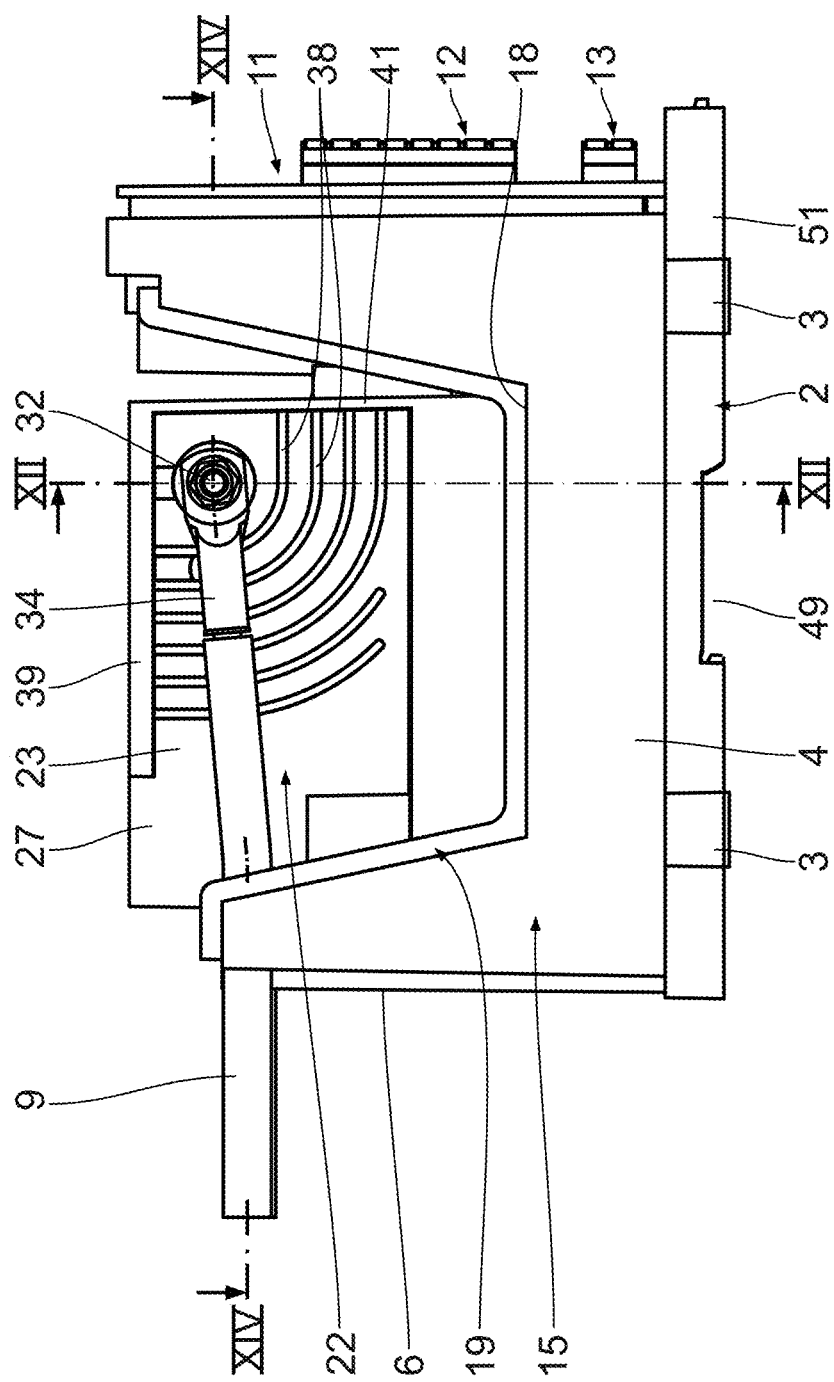

As furthermore becomes clear from FIGS. 9 to 14, the outer ends of the input connections 25, 26 are configured as threaded pins 32, 33, onto which corresponding cable lugs 34, 35 of the high-voltage connection lines 9, 10 can be placed and screwed. The connection lines 9, 10 themselves, as becomes clear in particular from FIG. 9, are led through respective through openings 36, 37 arranged laterally alongside the dome 22 in the vertical narrow side wall 6 of the housing pedestal 15, said through openings being embodied in each case as cutouts open upward transversely with respect to the lead-through direction D. As a result, the connection lines 9, 10 of the configuration shown in FIG. 9 can be inserted into the through openings 36, 37 in a very simple manner—if appropriate with the incorporation of sleeves 48 as sealing and anti-cake protection—and the cable lugs 34, 35 thereof can be screwed to the input connections 25, 26. This considerably simplifies mounting, but also leads to an accurately defined position of the connection lines 9, 10.

As is furthermore evident from FIG. 9, the zone on the side walls 23, 24 of the dome 22 around the input connections 25, 26 is provided with a rib profiling 38 extending in curved fashion, thus resulting in an increase in the creepage path between the two input connections 25, 26. The same purpose is served by the insulation roofs 39, 40 shaped in a canopy-roof-like fashion and projecting at the upper edge of the dome 25 above the input connections 25, 26, and the insulation webs 41, 42 extending alongside the input connections 25, 26 on the side toward the output connection region 11. Superficial rib profilings 43 for lengthening the creepage path are again provided here as well.

Figure 14:
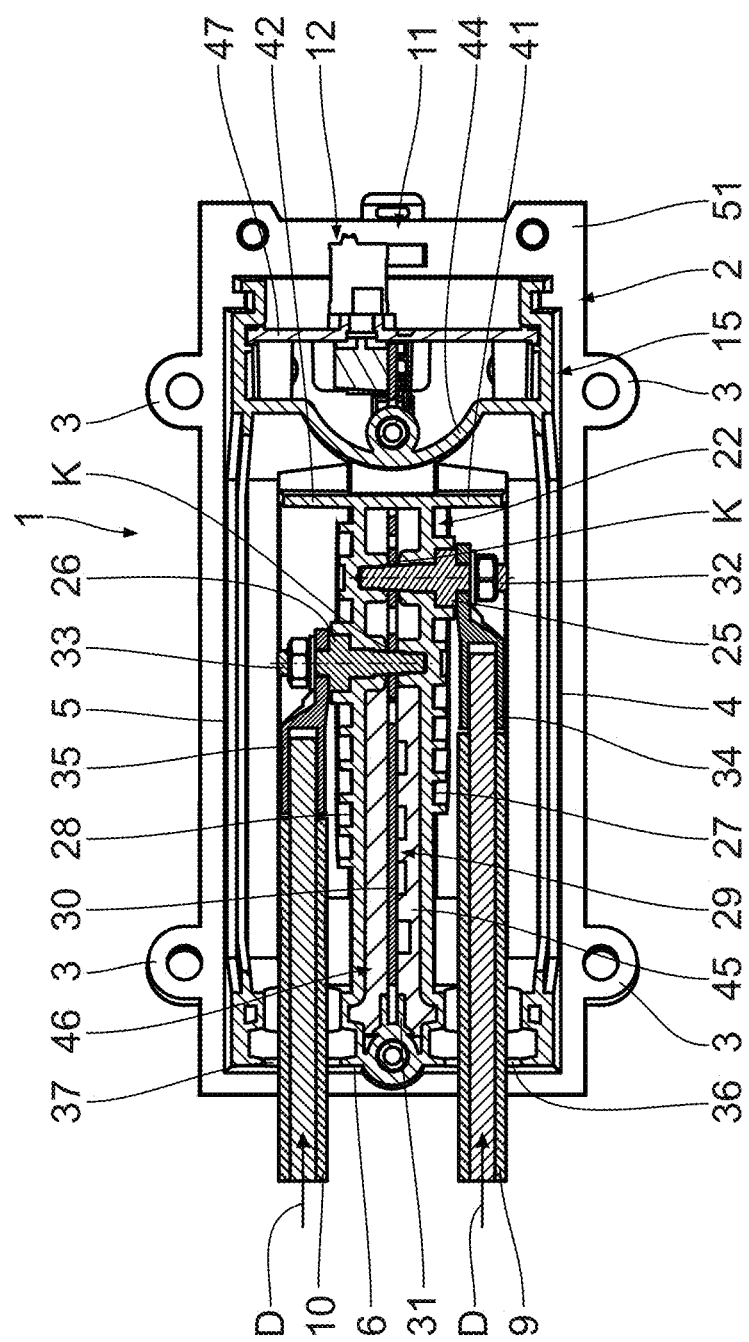
Figure 15:
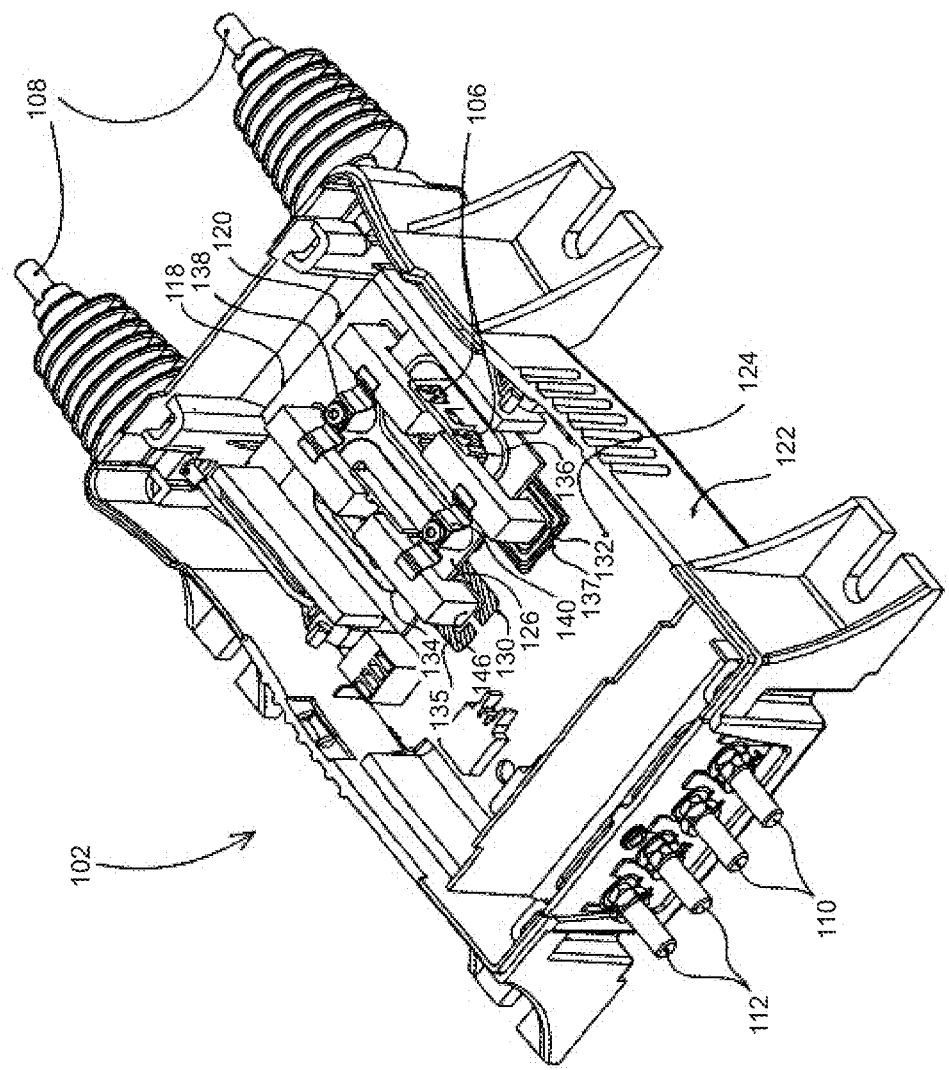
FIG. 15 shows a perspective illustration of a transducer in accordance with US 2010/0007358 A1.

As is evident in particular from FIG. 14, the printed circuit board 30 with its transducer circuit 29 is configured in integral fashion and continued right into the output connection region 11, where the corresponding terminals 12, 13 and operating and signaling elements 14 are attached. Between the actual transducer circuit 29 and said output connection region 11, however, the housing 1 is separated by a partition 44, wherein slots in printed circuit board 30 and partition 44, which slots continue alternately in the vertical direction and are not discernible in more specific detail in the drawings on account of the sectional positions, ensure that the printed circuit board 30 can be inserted into the housing from below and extend across said partition 44. Said slots can be hermetically sealed by means of suitable sealants, such as elastomer sealing strips. Hence it is then also possible that before the actual baseplate 50 is inserted into the circumferential base foot 51 of the housing pedestal 15, the interior of the dome 22 is vacuum-potted by a potting compound 45 indicated by wide hatching in FIGS. 12 and 13. Hence, in particular the transducer circuit 29 is sealed in the interior 46 of the dome 22.

In order that that part of the printed circuit board 30 which projects into the output connection region 11 is protected against being touched, finally on the outer side in front of the partition 44 a screen part 47 is arranged in the output connection region 11 between the section there of the printed circuit board 30 and the terminals 12, 13 fitted marginally to the printed circuit board 30 and, if appropriate, operating and/or signaling elements 14.

The high-voltage transducer is mountable on a mounting surface e.g. by means of fixed screw connection by way of the four laterally fitted securing eyes 3 or the top-hat rail holding device 49 arranged at the bottom on the base 2 and a top-hat rail interacting with said device.

To summarize, the high-voltage transducer according to the invention has been designed in particular for application in railroad technology. It satisfies the requirements in respect of insulation strength for railroad applications, such as are stipulated in particular in EN50124-1. In addition, the high-voltage transducer also satisfies the insulation requirements of EN 50178 (equipment of electrical power installations), UL347 (medium-voltage AC contactors, controllers, and control centers) and EN 61010-1 (safety provisions for electrical measuring, control, regulating and laboratory devices). The creepage paths and air clearances and strong insulation are embodied such that reliable protection of installations and persons is achieved even under harsh environmental conditions, such as moisture, dust, contamination and overvoltage events e.g. as a result of the action of lightning. The high-voltage transducer can be used for potentials and measurement voltages of up to approximately 5000 V. Besides further possible areas of use, the high-voltage transducer can be used for traction current monitoring in DC railroad power supplies, for precisely mapping the current profile for short-circuit identification, for monitoring traction converters or traction motors, auxiliary operation converters and rechargeable batteries. The diverse possibilities for use result in stringent requirements in respect of functionality, housing design, housing materials and electromechanical and electronic components.

The invention claimed is:

1. A transducer for high-voltage measuring technology, comprising
   a housing having a parallelepipedal basic contour,
   input connections arranged on the housing and carrying input measurement signals in the high-voltage range,
   output connections arranged on the housing and carrying output signals in the low-voltage range,
   a transducer circuit arranged in the housing and implemented on at least one printed circuit board, said transducer circuit being contact-connected to the input and output connections,
   wherein
   the parallelepipedal basic contour of the housing is designed as an upright construction with a width that is shorter than a length of a base surface (2) and with a height (H) that is greater than the width,
   the at least one printed circuit board with the transducer circuit is arranged upright between opposite side walls of an insulating dome formed in the housing, and
   the input connections are arranged facing away from one another on outer sides of the side walls within the parallelepipedal basic contour of the housing, and in a manner engaging through the respective opposite side wall of the insulating dome are in contact with contact elements of the transducer circuit on the at least one printed circuit board.

2. The transducer as claimed in claim 1, wherein at least one of the following applies: the ratio of width to length of the housing is between 1:2 and 1:3, and the ratio of width to height of the housing is between 1:1.5 and 1:2.5.

3. The transducer as claimed in claim 1, wherein the input connections are covered by a removable protective hood forming a part of the housing, said protective hood being secured to the rest of the housing pedestal.

4. The transducer as claimed in claim 3, wherein said protective hood is secured to the rest of the housing pedestal with the inclusion of sealing elements.

5. The transducer as claimed in claim 1, wherein a respective through opening for leading an input-side high-voltage connection line through to the input connections is arranged in the housing in each case laterally alongside the dome.

6. The transducer as claimed in claim 5, wherein said through-opening is arranged in the housing in a vertical side wall.

7. The transducer as claimed in claim 5, wherein the through openings are formed in the edge of the housing pedestal facing the protective hood, as a cutout open transversely with respect to the lead-through direction of the high-voltage connection lines.

8. The transducer as claimed in claim 1, wherein there are arranged at the dome at least one of the group comprising insulation roofs projecting above the input connections and insulation webs extending alongside the input connections.

9. The transducer as claimed in claim 8, wherein surface regions of the dome facing the input connections and, if present, the insulation roofs are provided with a superficial rib profiling.

10. The transducer as claimed in claim 1, wherein the input connections are configured as connection bolts which are held in a press-fitted manner in each case in the side walls of the dome and, as a result of the press-fit process, are electrically conductively connected to electrical contact pads of the transducer circuit on the printed circuit board.

11. The transducer as claimed in claim 1, wherein there is provided on an outer side of the housing, an output connection region which is separated from the transducer circuit, to which high voltage is applied, by a partition in the housing and in which the low-voltage output connections and, if appropriate, at least one of the group comprising further auxiliary energy connections, operating elements and signaling elements are arranged.

12. The transducer as claimed in claim 11, wherein said output connection region is provided on a narrow side of the housing.

13. The transducer as claimed in claim 1, wherein the interior of the dome with the transducer circuit is sealed by a potting.

14. The transducer at least as claimed in claim 11, wherein there are provided in the partition a slot open to the base of the housing and serving for passage of the printed circuit board, and also in the printed circuit board as an extension of the slot a recess for passage of the partition, said recess being open to its upper edge facing away from the base.

15. The transducer as claimed in claim 14, wherein said slot open to the base of the housing and said recess for passage of the partition are in each case sealable.

16. The transduced as claimed in claim 14, wherein said printed circuit board is configured in an integral fashion.

17. The transducer as claimed in claim 11, wherein on the outer side in front of the partition a screen part is arranged in the output connection region between the section there of the printed circuit board and the low-voltage output connections fitted marginally to the printed circuit board and, if appropriate, at least one of the group comprising further auxiliary connections, operating elements and signaling elements.

18. The transducer as claimed in claim 11, wherein the output connection region is covered by a protective cap that is removable from the housing.

19. The transducer as claimed in claim 18, wherein said protective cap is transparent.

\* \* \* \* \*